United States Patent [19]
Tsuruoka et al.

[11] Patent Number: 5,998,926
[45] Date of Patent: Dec. 7, 1999

[54] ORGANIC ELECTROLUMINESCENCE DEVICE HAVING APERTURED INSULATION LAYERS AND METHOD FOR MANUFACTURING THE SAME

[75] Inventors: Yoshihisa Tsuruoka; Hisamitsu Takahashi; Toshio Miyauchi, all of Mobara, Japan

[73] Assignee: Futaba Denshi Kogyo K.K., Mobara, Japan

[21] Appl. No.: 09/012,575

[22] Filed: Jan. 23, 1998

[51] Int. Cl.$^6$ ............................ H01J 1/62; H05B 33/00
[52] U.S. Cl. .................... 313/506; 313/504; 313/510; 313/503; 313/507
[58] Field of Search ...................... 313/498, 503, 313/506, 509, 510, 512, 504, 505, 511, 507, 508; 428/917; 345/45; 315/169.3

[56] References Cited

U.S. PATENT DOCUMENTS

| | | | |
|---|---|---|---|
| 3,341,916 | 9/1967 | Greene | 313/509 |
| 5,491,378 | 2/1996 | Lee et al. | 313/506 |
| 5,670,839 | 9/1997 | Noma et al. | 313/503 |
| 5,814,417 | 9/1998 | Nagayama | 313/511 |

Primary Examiner—Nimeshkumar D. Patel
Assistant Examiner—Joseph Williams
Attorney, Agent, or Firm—Oblon, Spivak, McClelland, Maier & Neustadt, P.C.

[57] ABSTRACT

A fixed pattern display device of the dynamic drive type with high definition including cathodes formed into a fine pattern by conventional photolithography. The cathodes are made of a metal material having a low resistance and arranged on an insulating substrate in the form of wiring patterns for fixed display segments of each of display patterns together with the display patterns. ITO which is resistant to water is exposed in the form of anodes each acting as a common electrode, resulting in arrangement of any protective film being eliminated.

6 Claims, 2 Drawing Sheets

5,998,926

ORGANIC ELECTROLUMINESCENCE DEVICE HAVING APERTURED INSULATION LAYERS AND METHOD FOR MANUFACTURING THE SAME

BACKGROUND OF THE INVENTION

This invention relates to an organic electroluminescence device, and more particularly to an organic electroluminescence device which is constructed into a laminate structure including anodes, hole transport layers made of an organic compound, luminous layers made of an organic compound and cathodes laminated on each other and includes a plurality of fixed display segments and a method for manufacturing the same.

An organic electroluminescence device (hereinafter also referred to as "organic EL") is expected to be a device which is capable of being accommodated to a variety of applications extending from a back light and a fixed pattern display device to a dot matrix device.

A typical organic EL which has been conventionally known in the art is reported by Tang et al of Kodak in Appl. Phys. Lett. in 1987 and generally constructed as shown in FIG. 4. More particularly, the organic EL reported generally includes cathodes 31 each of which is an electrode made of Mg:Ag, Al:Li or the like, anodes 32 each of which is a transparent electrode made of indium tin oxide (ITO), light-emitting or luminous layers 33 and organic hole transport layers 34 laminated on each other and interposed between the cathodes 31 and the anodes 32, and a glass substrate 35 arranged on an outside of the anodes 32. The luminous layers 33 each are made of a thin film of an organic phosphor.

In the organic EL thus constructed, the luminous layer 33 made of the organic phosphor thin film has electrons and positive holes injected thereinto from the cathode 31 and anode 32. Then, the electrons and positive holes thus injected are subject to recombination to form excitons, so that display may be carried out utilizing emission of light (fluorescence or phosphorescence) obtained due to deactivation of the excitons. The light thus emitted is externally observed through the glass substrate 35.

Unfortunately, the conventional organic EL causes problems when it is used for fixed pattern display of increased density. More particularly, when a wiring of the cathode 31 is made of ITO inherently increased in specific resistance in the case that it is required to form a fine pattern by dynamic driving or to stretch wirings, a resistance of the wirings is caused to be increased, resulting in both non-uniform display and an increase in drive voltage being due to voltage drop through the wiring, leading to a failure to provide a fixed pattern display device of the dynamic drive type with high definition which has a wiring width as small as 0.1 mm or less. In order to address to the problem, it is required to remove a display section to carry out specific patterning such as, for example, a two-layer wiring or the like, to thereby correct the resistance, as disclosed in Japanese Patent Application Laid-Open Publication No. 307997/1993. Unfortunately, this causes a deterioration in productivity of the organic EL.

Another problem of the conventional original EL is that when a signal electrode is formed by forming a metal material for the cathode with a fine pattern while using ITO as a common electrode, it is required to subject the cathode 31 made of a metal film formed on the organic luminous layer 33 to patterning by dry processing. This is for the reason that water absorbed on the organic EL deteriorates quality of the organic EL to adversely affect performance thereof, therefore, it is substantially impossible to subject the organic EL to a wet treatment after formation of the organic layer. Thus, photolithography cannot be applied to formation of the cathode 31 which is a metal electrode. Substitutionally, mask deposition or patterning by laser is attempted for this purpose as disclosed in Japanese Patent Application Laid-Open Publication No. 3076/1993. However, the mask deposition substantially fails to render the patterning fine, to thereby reduce a degree of freedom in design of the original EL. Also, the patterning by laser requires to scan laser, resulting in being time-consuming and deteriorating productivity of the original EL.

Further, in the conventional original EL, the cathode 31 is made of a metal material decreased in work function such as Al:Li, Mg:Ag, Mg:In or the like. Thus, the organic EL has a further disadvantage that it is required to form a protective film of fluororesin such as SiO, GeO or the like on the cathode 31, because the cathode 31 is exposed on the organic luminous layer 33.

SUMMARY OF THE INVENTION

The present invention has been made in view of the foregoing disadvantages of the prior art.

Accordingly, it is an object of the present invention to provide an organic EL which is capable of permitting fine patterning of cathodes therefor to be effectively attained using conventional photolithography.

It is another object of the present invention to provide an organic EL which is capable of realizing a fixed pattern display device with high definition which is dynamically driven.

It is a further object of the present invention to provide an organic EL which is capable of being reduced in voltage drop to a degree sufficient to prevent an increase in drive voltage as compared with the prior art.

It is still another object of the present invention to provide an organic EL which is capable of substantially increasing a degree of freedom in design thereof.

It is yet another object of the present invention to provide a method for manufacturing an organic EL which is capable of permitting fine patterning of cathodes for the EL to be attained using conventional photolithography.

It is another object of the present invention to provide a method for manufacturing an organic EL which is capable of realizing a fixed pattern display device with high definition which is dynamically driven.

It is a further object of the present invention to provide a method for manufacturing an organic EL which is capable of providing an organic EL reduced in voltage drop to a degree sufficient to prevent an increase in drive voltage as compared with the prior art.

It is still another object of the present invention to provide a method for manufacturing an organic EL which is capable of providing an organic EL increased in a degree of freedom in design thereof.

In accordance with one aspect of the present invention, an organic EL is provided. The organic EL includes an insulating substrate, cathodes made of a metal material having a low resistance and arranged on the insulating substrate in the form of wiring patterns for fixed display segments of each of display patterns together with the display patterns, insulating layers each laminatedly formed on each of the cathodes and formed with an aperture through which each of the fixed display segments is partially exposed, electron injection layers each laminatedly formed on each of the insulating layers so as to cover each of the apertures, luminous layers each laminatedly formed on each of the electron injection layers, hole transport layers each laminatedly formed on each of the luminous layers, and anodes each laminatedly formed on each of the hole transport layers.

In a preferred embodiment of the present invention, the electron injection layers each are made of a material selected from the group consisting of an element metal material reduced in work function and an alloy material reduced in work function.

In a preferred embodiment of the present invention, the anodes each are made of ITO.

In accordance with another aspect of the present invention, a method for manufacturing an electroluminescence device is provided. The method includes the steps of forming cathodes of a metal material of a low resistance on an insulating substrate in the form of wiring patterns for fixed display segments of each of display patterns together with the display patterns, laminatedly forming each of insulating layers on each of the cathodes while providing each of the insulating layers with an aperture through which each of the fixed display segments is partially exposed, laminatedly forming each of electron injection layers on each of the insulating layers while covering each of the apertures, laminatedly forming each of luminous layers on each of the electron injection layers, laminatedly forming each of hole transport layers on each of the luminous layers, and laminatedly forming each of anodes on each of the hole transport layers.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Figure 1:
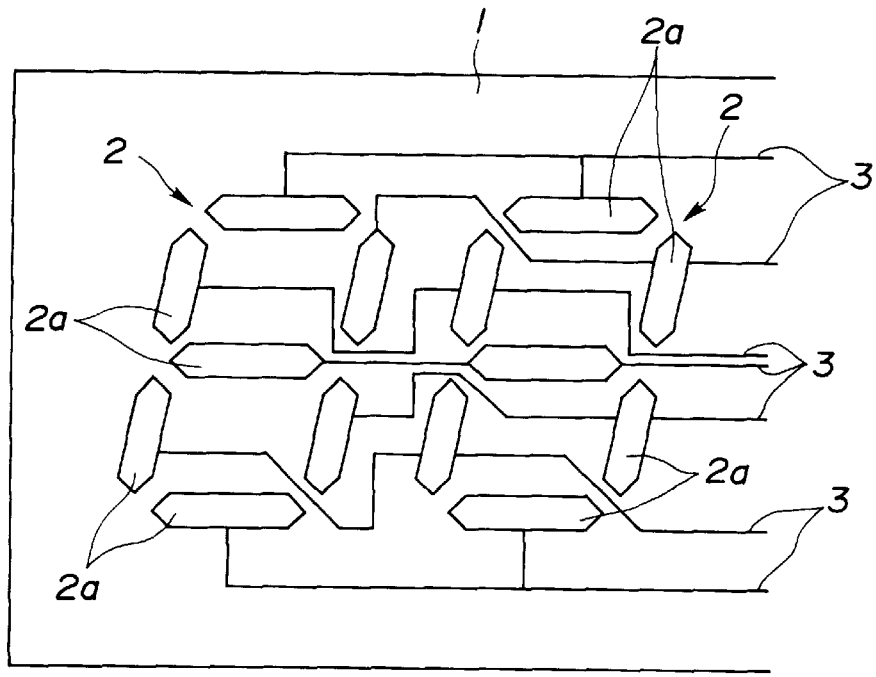
FIG. 1 is a fragmentary schematic plan view showing an embodiment of an organic EL according to the present invention.

Now, an organic EL according to the present invention will be described hereinafter with reference to FIGS. 1 to 3, wherein like reference numerals designate like or corresponding parts throughout.

Figure 2:
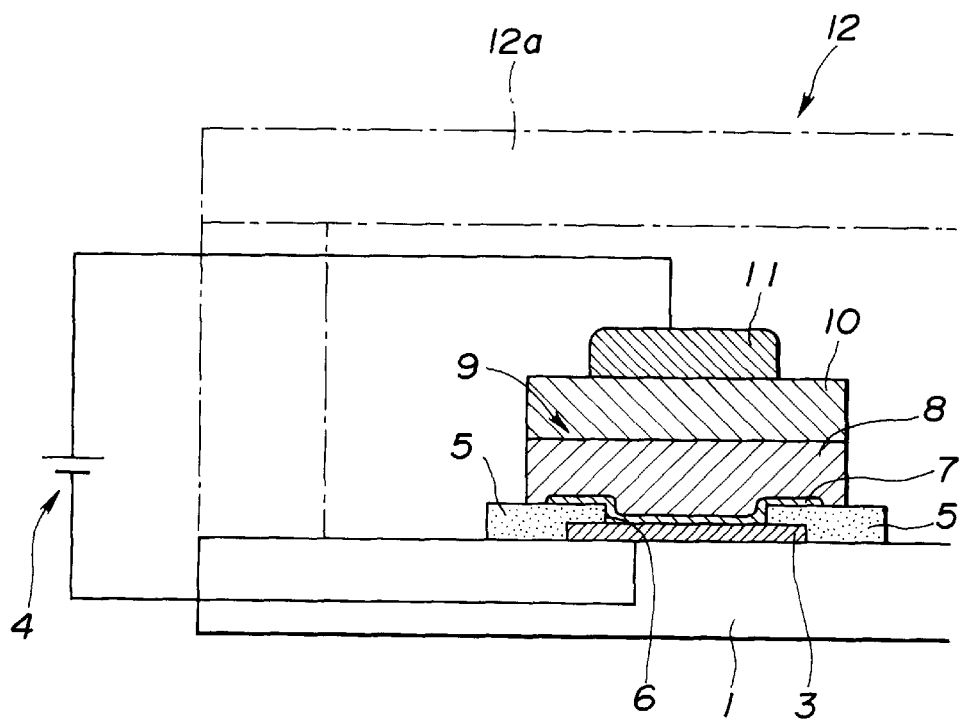
FIG. 2 is a sectional view of the organic EL shown in FIG. 1.
Figure 3:
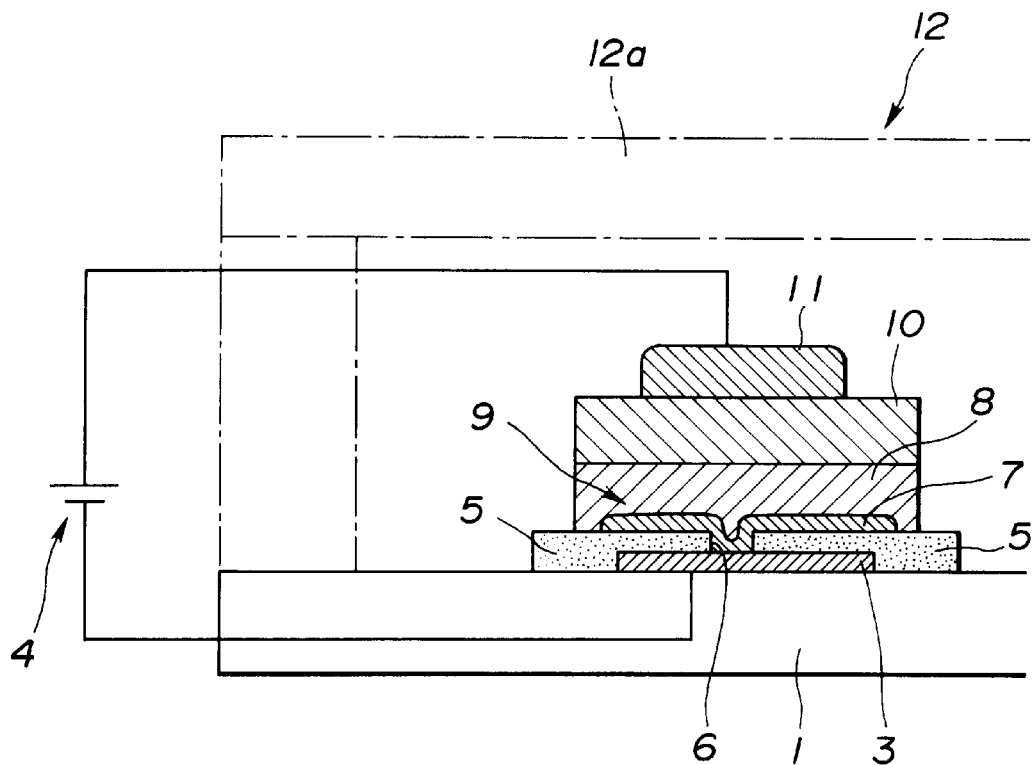
FIG. 3 is a sectional view showing another embodiment of an organic EL according to the present invention.
Figure 4:
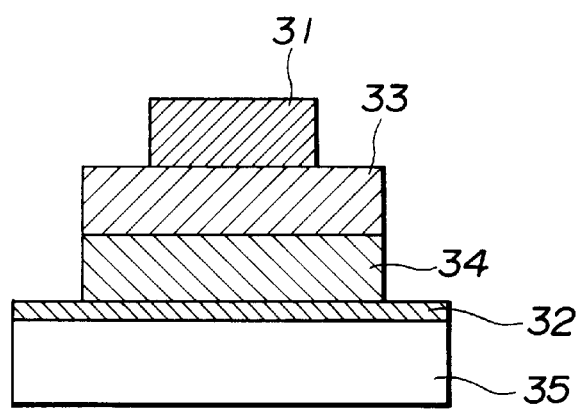
FIG. 4 is a sectional view showing a conventional organic EL.

Referring first to FIGS. 1 and 2, an embodiment of an organic EL according to the present invention is illustrated. An organic EL of the illustrated embodiment includes a substrate 1 made of an insulating material such as glass or the like and formed into a rectangular shape. The glass substrate 1, as shown in FIG. 1, is formed thereon with fixed display segments (hereinafter also referred to as "segments") 2a constituting display patterns 2 each having a shape of the FIG. 8, as well as wiring patterns each constituting a cathode 3.

The cathodes 3 each are arranged in the lump in a manner to be common to segments 2a of the display patterns 2 of the respective digits corresponding to each other and connected to a negative terminal of a power supply 4. The cathodes 3 are subject to dynamic driving during luminescence, so that electrons are injected into the display pattern 2 for every digit in a time-division manner.

The display patterns 2 each have insulating layers 5 laminatedly formed thereon. More particularly, the insulating layers 5, as shown in FIG. 2, each are formed with an aperture 6 which permits a part of each of the segments 2a to be exposed therethrough. The insulating layer 5 is laminatedly formed on the display pattern 2 so as to cover a portion of the display pattern 2 except the opening 6.

Reference numeral 7 (FIG. 2) designates electron injection layers 7 each formed between the portion of each of the segments 2a exposed through each of the apertures 6 and a portion of the insulating layer 5 positioned around the aperture 6 in a manner to correspond to each of actual light-emitting or luminous sections of the display pattern 2. The electron injection layer 7 may be made of either metal reduced in work function such as, for example, Li, Na, Mg, Ca or the like or alloy reduced in work function such as, for example, Al:Li, Mg:In, Mg:Ag or the like in order to facilitate injection of electrons thereinto.

When the electron injection layers 7 each are made in the form of a thin film of a thickness as small as tens to hundreds of angstroms (Å), it may be formed all over the insulating layer 5. In this instance, the electron injection layer 7 is insulated in a lateral direction along a surface of the glass substrate 1 so as to exhibit a function as only electron injection.

The electron injection layers 7, as shown in FIG. 2, each are laminatedly formed on a front surface thereof with a light-emitting or luminous layer 8 so as to cover the whole electron injection layer 7. Each of the luminous layer 7, when it is constructed so as to emit light by itself, may be made of aluminum quinoline, distyryl arylene or the like. Alternatively, when the luminous layer 8 is so constructed that a luminous material (dopant) separate from the luminous layer is doped in a trace amount in the luminous layer 8 for light emission, quinacrydone (Qd), a pigment for laser or the like may be used as the dopant. The luminous layers 8 thus formed each act to constitute a display section 9 of each of seven display segments 2a constituting each one display unit.

The luminous layers 8, as shown in FIG. 2, each are laminatedly formed on a front or upper surface thereof with a hole transport layer 10, which is made of an organic compound such as, for example, diamine or the like. The hole transport layer 10 is formed into a configuration identical with that of the luminous layer 8.

The hole transport layers 10 each are laminatedly formed on a front or upper surface thereof with an anode 11 for every digit of each of the display patterns 2 in a manner to extend all over the hole transport layer 10. Each of the anodes 11 is a transparent electrode made of ITO and connected to a positive terminal of the power supply 4. The anode 11 is injected with positive holes for every digit of each display pattern 2 during driving thereof for luminescence.

The glass substrate 1, as shown in FIG. 2, has a lid-like glass casing 12 sealedly joined thereto in a manner to cover it. Luminescence provided by each of the display sections 9 is observed through a flat plate 12a of the glass casing 12.

Now, manufacturing of the organic EL of the illustrated embodiment thus constructed will be described hereinafter.

First, the glass substrate 1 is fully cleaned. Then, the glass substrate 1 thus cleaned is formed thereon with a metal film for wirings. The film is made of a metal material of a low resistance which is stable in air as well. This results in the display patterns 2 desired and the cathodes 3 by wiring patterns stretched or drawn around being formed on the same plane of the glass substrate 1.

Formation of the display patterns 2 and the wiring patterns for the cathodes 3 may be carried out by means of any suitable procedure such as photolithography, mask deposition or the like. The metal film for the display patterns 2 and that for the wiring patterns for the cathodes 3 may be formed of a metal material selected from corrosion-resistant metals relatively increased in work function such as, for example, Al, Ag, Ni, Cu and the like.

Then, the insulating layers 5 each are laminatedly formed on a portion of glass substrate 1 except each of display pattern sections which are subject to driving for luminescence. More particularly, the insulating layers 5 which are arranged on the glass substrate 1 each are formed with the aperture 6 through which each of the segments 2a of each of the display patterns 2 is partially exposed. The insulating layers 5 may be made of an inorganic glass material, a fluoro polymer material or the like by any suitable means such as a combination of printing and calcination, mask deposition, or the like, resulting in providing a laminate.

Thereafter, a surface of the thus-provided laminate is cleaned by plasma cleaning or UV ozone cleaning and then placed in a vacuum tank. A subsequent treatment is carried out by a fully dry process.

Then, either the display pattern sections each of which is defined so as to extend between the segment 2a exposed through the aperture 6 and the portion of the insulating layer 5 defined around the aperture 6 or the whole insulating layer 5 is formed thereon with a film of metal decreased in work function such as, for example, Li, Na, Mg, Ca or the like or alloy reduced in work function such as, for example, Al:Li, Mg:In, Mg:Ag or the like by mask deposition, resulting in the electron injection layer 7 being provided.

At this time, the electron injection layer 7 is arranged in a thickness of tens to hundreds of angstroms (Å) all over the insulating layer 5. Alternatively, it may be selectively formed on only the display section. A decrease in thickness of the electron injection layer 7 thus formed permits the electron injection layer 7 to be insulated in a lateral direction along the surface of the glass substrate 1, so that the layer 7 may exhibit only a function of injecting electrons into the display section 9.

Subsequently, the electron injection layers 7 each are formed thereon with the luminous layer 8 and hole transport layer 10 in the form of a film in order. Then, ITO is laminatedly formed on the hole transport layer 10 by vacuum deposition, sputtering or the like, to thereby provide the anode 11 which acts as a hole injection electrode. At this time, the anode 11 made of ITO is merely required to function as a common electrode, so that it is not required to form the anode 11 into a close or accurate configuration.

Then, the glass casing 12 is sealedly joined to an outer peripheral portion of the glass substrate 1 in a dry atmosphere from which moisture has been removed to the utmost such as, for example, dry nitrogen, dry air or the like, to thereby provide a sealed envelope. This permits the organic EL for fixed pattern display with high definition to be completed.

As described above, the illustrated embodiment permits the cathodes 3 to be formed into a fine pattern by conventional photolithography, resulting in providing a fixed pattern display device with high definition which is dynamically driven.

Also, in the illustrated embodiment, the wirings for the cathodes 3 of a fine pattern may be made of metal such as, for example, Al, Ag, Ni, Cu or the like which is decreased in resistance and stable as compared with ITO for the conventional wirings, to thereby facilitate patterning of the cathodes as compared with the prior art using ITO, so that a degree of freedom in design of the fixed pattern display device may be increased. Also, the wirings made of the metal leads to a reduction in voltage drop as compared with the prior art using ITO, to thereby prevent an increase in drive voltage.

Further, the illustrated embodiment eliminates any processing which deteriorates productivity of the organic EL such as laser processing, two-layer wirings or the like.

Furthermore, in the prior art, the cathode is made of a metal material highly reduced in work function (alloy such as Al:Li, Mg:Ag, Mg:In or the like), so that a protective film is required for protecting the cathode exposedly formed on the organic layer. On the contrary, in the illustrated embodiment, ITO which is resistant to water is exposed in the form of the anode 11 acting as the common electrode, resulting in eliminating arrangement of such a protective film as required in the art.

In FIG. 2, the electron injection layer 7 is arranged in the form of a thin film having a thickness as small as tens to hundreds of angstroms (Å). Alternatively, it may be formed into a thickness as large as thousands of angstroms (Å). In this instance, the apertures 6 each are configured into a through-hole of a reduced diameter and the electron injection layers 7 each provide the display section 9 actually acting as a luminous section.

As can be seen from the foregoing, the present invention permits the cathodes to be formed into a fine pattern by conventional photolithography, resulting in providing a fixed pattern display device of the dynamic drive type with high definition.

Also, the present invention permits the wirings for the cathodes of such a fine pattern to be made of metal which is decreased in resistance and stable as compared with ITO for the conventional wirings, to thereby facilitate patterning of the cathodes as compared with the prior art using ITO, so that a degree of freedom in design of the fixed pattern display device may be increased. Also, the wirings made of the metal leads to a reduction in voltage drop as compared with those of ITO, to thereby prevent an increase in drive voltage. Further, the present invention eliminates any processing which deteriorates productivity of the organic EL such as laser processing, two-layer wirings or the like.

In addition, the present invention is so constructed that ITO which is resistant to water is exposed in the form of the anode 11 acting as the common electrode. Such construction eliminates arrangement of such a protective film as required in the art.

While a preferred embodiment of the invention has been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. An organic electroluminescence device comprising:
   an insulating substrate;
   cathodes made of a metal material having a low resistance and arranged on said insulating substrate in the form of wiring patterns for fixed display segments of each of display patterns together with said display patterns;

insulating layers each laminatedly formed on each of said cathodes and formed with an aperture through which each of said fixed display segments is partially exposed;

electron injection layers each laminatedly formed on each of said insulating layers so as to cover each of said apertures;

luminous layers each laminatedly formed on each of said electron injection layers;

hole transport layers each laminatedly formed on each of said luminous layers; and anodes each laminatedly formed on each of said hole transport layers.

2. An organic electroluminescence device as defined in claim 1, wherein said electron injection layers each are made of a material selected from the group consisting of a metal reduced in work function and a metal alloy reduced in work function.

3. An organic electroluminescence device as defined in claim 1, wherein said anodes each are made of ITO.

4. A method for manufacturing an electroluminescence device, comprising the steps of:

forming cathodes of a metal material of a low resistance on an insulating substrate in the form of wiring patterns for fixed display segments of each of display patterns together with said display patterns;

laminatedly forming each of insulating layers on each of said cathodes while providing each of said insulating layers with an aperture through which each of said fixed display segments is partially exposed;

laminatedly forming each of electron injection layers on each of said insulating layers while covering each of said apertures;

laminatedly forming each of luminous layers on each of said electron injection layers;

laminatedly forming each of hole transport layers on each of said luminous layers; and laminatedly forming each of anodes on each of said hole transport layers.

5. A method as defined in claim 4, wherein said electron injection layers each are made of a material selected from the group consisting of a metal reduced in work function and a metal alloy reduced in work function.

6. A method as defined in claim 4, wherein said anodes each are made of ITO.

* * * * *

UNITED STATES PATENT AND TRADEMARK OFFICE
CERTIFICATE OF CORRECTION

PATENT NO.   : 5,998,926
DATED        : December 7, 1999
INVENTOR(S)  : Yoshihisa Tsuruoka et al.

Page 1 of 1

It is certified that error appears in the above-identified patent and that said Letters Patent is hereby corrected as shown below:

On the title page, item [30], the Foreign Application Priority Data has been omitted. It should read as follows:

--[30] Foreign Application Priority Data

Jan. 29, 1997 [JP] Japan........................09-015378--

Signed and Sealed this

Nineteenth Day of June, 2001

*Attest:*

NICHOLAS P. GODICI
*Attesting Officer*   Acting Director of the United States Patent and Trademark Office